(12) United States Patent
Richardson

(10) Patent No.: US 7,923,630 B2
(45) Date of Patent: Apr. 12, 2011

(54) SEALED AND COOLED ENCLOSURE WITH VOLTAGE ISOLATION

(75) Inventor: Robert Richardson, Chelmsford (GB)

(73) Assignee: E2V Technologies (UK) Limited, Chelmsford (GB)

( * ) Notice: Subject to any disclaimer, the term of this patent is extended or adjusted under 35 U.S.C. 154(b) by 423 days.

(21) Appl. No.: 12/076,525

(22) Filed: Mar. 19, 2008

(65) Prior Publication Data
US 2008/0239662 A1  Oct. 2, 2008

(30) Foreign Application Priority Data

Mar. 29, 2007 (GB) .................... 0706196.3

(51) Int. Cl.
    *H05K 5/02* (2006.01)
(52) U.S. Cl. ............... 174/17 LF; 174/15.1; 361/676
(58) Field of Classification Search ............ 174/15.1, 174/17 LF; 361/676–678
    See application file for complete search history.

(56) References Cited

U.S. PATENT DOCUMENTS

| | | | | |
|---|---|---|---|---|
| 4,100,366 A | * | 7/1978 | Mears | 174/15.1 |
| 4,440,971 A | | 4/1984 | Harrold | |
| 4,694,375 A | * | 9/1987 | Devins et al. | 361/212 |
| 6,184,459 B1 | | 2/2001 | McShane et al. | |
| 6,717,812 B1 | * | 4/2004 | Pinjala et al. | 361/699 |
| 2005/0157480 A1 | | 7/2005 | Sun et al. | |

FOREIGN PATENT DOCUMENTS

| | | |
|---|---|---|
| GB | 2161989 | 1/1986 |
| WO | WO 2005/081401 | 9/2005 |

OTHER PUBLICATIONS

United Kingdom Search Report dated Jul. 16, 2007 priority application GB 0706196.3.

* cited by examiner

*Primary Examiner* — Dhiru R Patel
(74) *Attorney, Agent, or Firm* — Venable LLP; Robert Kinberg; Leigh D. Thelen

(57) ABSTRACT

An enclosure (4) for electrical apparatus (6) has a sealable outlet (8) for partially evacuating the enclosure and a sealable inlet (9) for partially filling the enclosure with a liquid (7) having a vapor pressure at operating temperatures of the apparatus suitable to enhance electrical isolation of the electrical apparatus and suitable to provide convective cooling of the electrical apparatus. The vapor preferably provides a voltage hold-off sufficiently high for operating voltages of the electrical apparatus and has a relative permittivity sufficiently low to prevent stray capacitance in the electrical apparatus above a predetermined limit.

21 Claims, 2 Drawing Sheets

SEALED AND COOLED ENCLOSURE WITH VOLTAGE ISOLATION

CROSS-REFERENCE TO RELATED APPLICATIONS

This application claims priority from UK patent application GB 0706196.3 filed Mar. 29, 2007.

FIELD OF THE INVENTION

This invention relates to a sealed and cooled enclosure with voltage isolation.

BACKGROUND OF THE INVENTION

It is well known that sealing an electronics assembly or system in an enclosure to exclude an ambient environment can improve reliability of the system. Effects on the system of damp, particles, pollution, and changes in ambient atmospheric pressure and density may be substantially eliminated. It is known that for high voltage systems protection from these undesirable environments is even more important and use of a sealed enclosure to protect a high voltage assembly or system is well known.

Known methods, such as described in WO 2005/081401, may also be used to extract heat from an assembly in an enclosure, for example, by circulation of air between an internal heat exchanger and an external heat exchanger.

High voltage breakdown is very difficult to avoid in a low pressure gas environment, so it is not uncommon to fill such an enclosure with a liquid such as mineral oil, silicone oil 561, or a liquid fluorocarbon such as Fluorinert™ Electronic Liquid FC-72 available from 3M™, 3M Center, St. Paul, Minn. 55144-1000, USA. While this enhances both cooling and voltage hold off capabilities of electrical equipment within the enclosure, filling the enclosure with liquid significantly increases a weight of a system and requires means to accommodate expansion of the liquid. This may restrict usable locations or positions of the assembly. Many otherwise suitable liquids have a high dielectric constant and this significantly raises stray capacitance, which can be undesirable in, for example, high voltage Switched Mode Power Supply (SMPS) applications. Moreover, some otherwise suitable liquids are very expensive and this additional cost can have significant adverse implications on a cost of the complete system.

U.S. Pat. No. 4,440,971 discloses the use of unstable supersaturated vapor dielectrics but only a momentary and instantly formed high breakdown strength is possible without refrigeration.

SUMMARY OF THE INVENTION

According to a first aspect of the invention, there is provided a an enclosure for electrical apparatus comprising sealable outlet means for partially evacuating the enclosure and sealable inlet means for partially filling the enclosure with a liquid having a vapor pressure at operating temperatures of the apparatus suitable for a vapor from the liquid to enhance electrical isolation of the electrical apparatus and for the vapor to provide convective cooling of the electrical apparatus.

Advantageously, a vapor of the liquid provides a voltage hold-off sufficiently high for operating voltages of the electrical apparatus and has a relative permittivity sufficiently low to prevent stray capacitance due to the vapor above a predetermined limit.

Conveniently, the enclosure comprises at least one aperture hermetically sealable with closure means through which the electrical apparatus may be located in the enclosure.

Advantageously, the enclosure comprises reservoir means within the enclosure for the liquid.

Conveniently, the enclosure further comprises forced convection means within the enclosure arranged to enhance cooling of the electrical apparatus.

Conveniently, the enclosure further comprises liquid transport means for transporting liquid from the reservoir means to a component of the electrical apparatus for enhancing cooling of the component.

Advantageously, the liquid transport means comprises pump means.

Conveniently, the liquid transport means comprises spray means arranged to spray liquid from the reservoir means onto the component.

Advantageously, a component of the electrical apparatus is located at least partially within the reservoir means to enhance cooling of the component.

Conveniently, the enclosure comprises liquid return means for transferring condensed vapor to the reservoir means.

Advantageously, at least one wall of the enclosure is arranged to guide condensed vapor towards the reservoir means.

Advantageously, the liquid is a liquid fluorocarbon.

According to a second aspect of the invention, there is provided a method of enclosing electrical apparatus comprising the steps of: locating the electrical apparatus in an hermetically sealable enclosure; baking the electrical assembly and enclosure to remove moisture therefrom; partially evacuating the enclosure; introducing a liquid into the enclosure to form a saturated vapor within the enclosure; and hermetically sealing the enclosure, such that vapor from the liquid enhances electrical isolation of the electrical apparatus and provides convective cooling of the electrical apparatus.

Conveniently, the step of locating the electrical apparatus in the hermetically sealed enclosure comprises passing the electrical apparatus into the enclosure through at least one aperture therein and hermetically sealing the opening with closure means.

Advantageously, the step of partially evacuating the enclosure comprises evacuating the enclosure through an outlet and sealing the outlet.

Advantageously, the step of introducing a liquid into the enclosure comprises introducing the liquid through an inlet and sealing the inlet.

Advantageously, the step of introducing a liquid comprises introducing liquid having a vapor which provides a voltage hold-off sufficiently high for operating voltages of the electrical apparatus and has a relative permittivity sufficiently low to prevent stray capacitance due to the vapor above a predetermined limit.

Advantageously, the step of introducing a liquid comprises introducing liquid fluorocarbon.

Conveniently, the method further comprises producing forced convection of the vapor within the enclosure.

Advantageously, the method further comprises transporting liquid from reservoir means within the enclosure to a component of the electrical apparatus to enhance cooling of the component.

Conveniently, transporting liquid to a component comprises spraying the component with the liquid.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the accompanying drawings, in which.

DETAILED DESCRIPTION OF PREFERRED EMBODIMENTS

Figure 1:
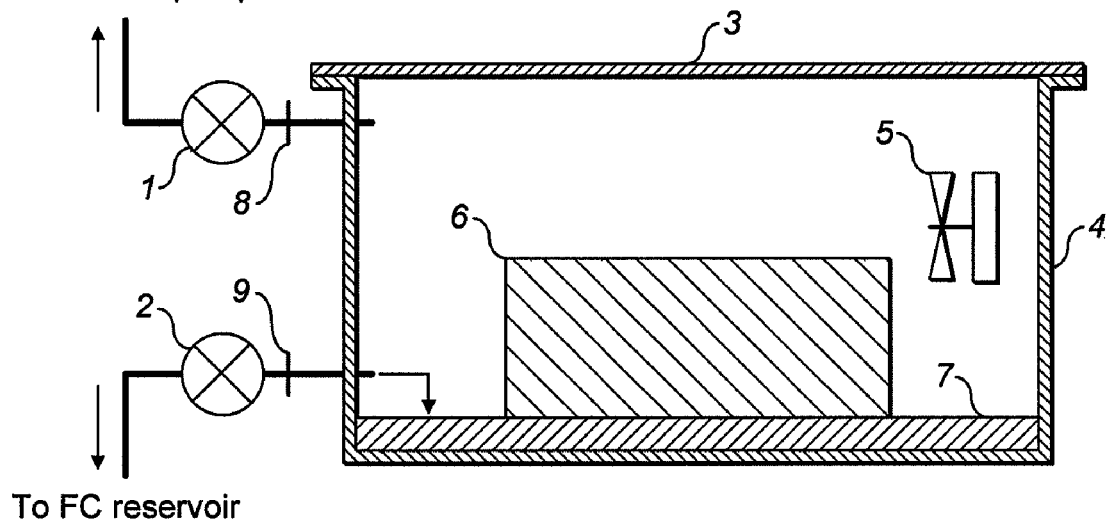
FIG. 1 is a schematic drawing of a first embodiment of an enclosure according to the invention.

Throughout the description, identical reference numerals are used to identify like parts.

Referring to FIG. 1, a high voltage electronics system 6, with any other required additional components, is located in an enclosure 4 having a hermetically sealable closure or lid 3 closing an opening in the enclosure. In one embodiment the high voltage electronics system includes circuits working in a range of 1,000 to 50,000 volts. The enclosure is provided with an outlet pipe 8 and outlet valve 1 to which a vacuum pumping system, not shown, is connectable. The enclosure is further provided with an inlet pipe 9 and inlet valve 2 connectable to an external liquid fluorocarbon reservoir, not shown. The enclosure is further provided with an internal fan 5.

Figure 4:
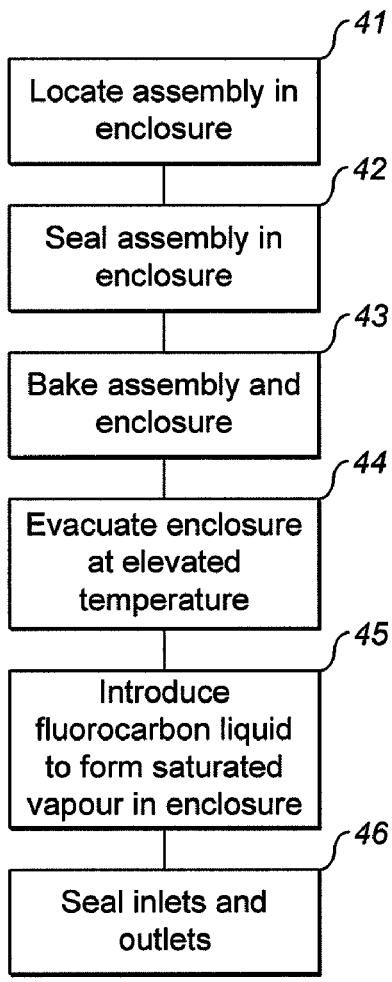
FIG. 4 is a flowchart of a method according to a further aspect of the invention of preparing an enclosure according to the invention for use.

Referring also to FIG. 4, prior to use the electronics system is located 41 in the enclosure and the enclosure lid sealed closed 42 in any suitable known manner. The enclosure and assembly are baked 43 at a temperature suitable to dry the electronics assembly fully. A vacuum system, not shown, is connected to the outlet valve 1 and, with the outlet valve 1 open, air and water vapor are pumped 44 from the enclosure by the vacuum system, while maintaining the enclosure at an temperature, such as 140 deg. C., elevated with respect to an ambient temperature. After a suitable pumping out time, such as 2 hours, at a suitable reduced pressure, such as $10^{-4}$ Torr, the valve 1 is closed and inlet valve 2 is opened to allow a controlled quantity of, liquid fluorocarbon to be introduced 45 to form an internal reservoir 7 of liquid fluorocarbon in the enclosure, and conveniently in a base of the enclosure. The inlet valve 2 is closed and the enclosure sealed off from the ambient environment by a process that both cuts and seals 46 the outlet and inlet pipes 8 and 9, so that an internal volume of the enclosure is substantially sealed from the outside environment.

It will be understood that alternatively a single input/output could be provided for evacuating the enclosure and subsequently partially filling the enclosure with liquid.

An "atmosphere" or environment in the enclosure is thereby determined within an operating temperature range by a vapor pressure and temperature characteristic of the added liquid fluorocarbon 7, provided that a mass of the added liquid fluorocarbon 7 is sufficient to ensure full saturation of the internal volume with vapor at a highest temperature at which the assembly is required to operate. A volume of liquid fluorocarbon required is a very small proportion of the total capacity of the enclosure. A volume added is preferably sufficient to provide an initial saturated vapor plus a suitable excess to ensure that a saturated vapor is maintained despite any leakage or other loss over a lifetime of the assembly or until the liquid fluorocarbon may conveniently be replenished.

FC-72 at 30° C. has a vapor density of 0.005 kg/liter and at 60° C., when the vapor pressure is 1.12 bar, the vapor density rises to only 0.0147 kg/liter, so that in a 10 liter enclosure a mass of the vapor is approximately only 150 grams. Using, for example, 300 grams of the liquid fluorocarbon a more than adequate reservoir would exist to maintain full saturation of the internal volume of the enclosure.

An absolute pressure in the enclosure will be typically only 100 mB at 25° C. using FC72, but even at this low pressure liquid fluorocarbon vapor has extremely good voltage hold off properties, which are superior to air at normal temperatures and pressures. Fluorocarbon vapor even at low pressure and density also has good thermal properties and so heat transfer occurs by natural convection.

Compared with filling the enclosure with a liquid insulator, a saving in cost and weight of liquid and elimination of a need for a liquid expansion system results in a simpler mechanical system.

As the temperature increases in the enclosure, the vapor pressure rises which further improves the electrical insulation and thermal properties. Thus, as the temperature of the system increases, thermal and voltage hold off properties improve. Even although the dielectric constant of the liquid may be significantly higher than air (relative permittivity Er=2.2 for FC72) in its vapor phase the dielectric constant is, to all intents and purposes, the same as air (Er=1).

As shown in FIG. 1, cooling may be further improved by using a small fan 5 inside the enclosure to provide a degree of forced convection.

Figure 2:
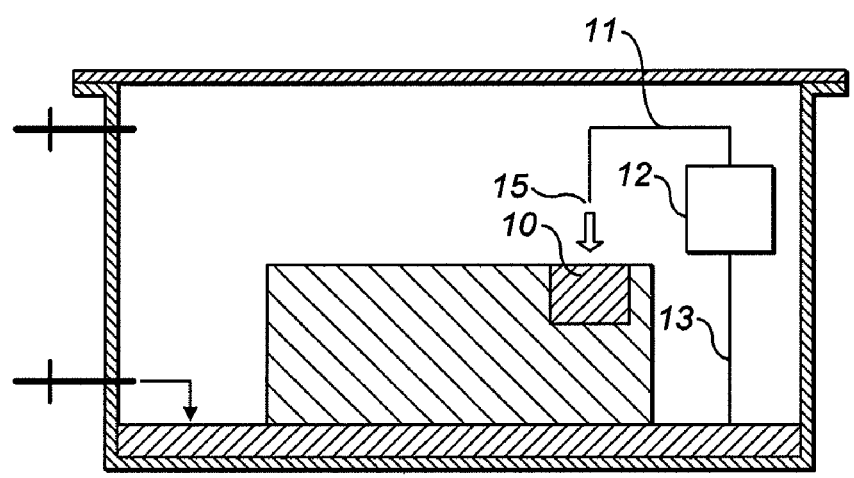
FIG. 2 is a schematic drawing of a second embodiment of an enclosure according to the invention with an inlet and outlet sealed.

Referring to FIG. 2, in a further embodiment, where there is a need for particular heat transfer from one or more components 10 especially subject to, or susceptible to, heating, an internal pump 12 and associated piping 11, 13 are provided to transfer liquid fluorocarbon from the internal reservoir 7 to pump or spray liquid fluorocarbon over the one or more components using a spray device 15. This produces significant cooling by evaporation of the liquid to vapour thereby extracting latent heat of vaporisation from the one or more components—this is a very effective method of cooling.

Figure 3:
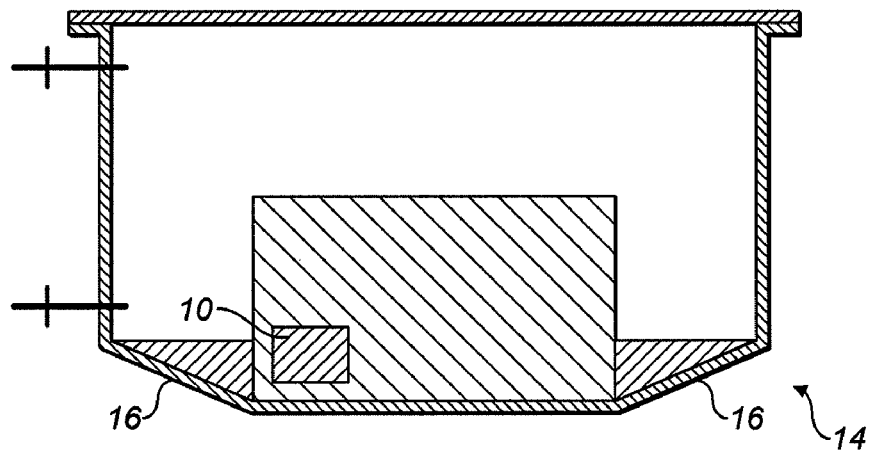
FIG. 3 is a schematic drawing of a third embodiment of an enclosure according to the invention.

Referring to FIG. 3, in a further embodiment one or more components 10 especially subject to, or susceptible to, heating, are located in contact with the liquid fluorocarbon in the internal reservoir 7. The one or more components 10 may act as a heat source for generating the vapour pressure. The enclosure 14 is preferably suitable shaped to provide a liquid return mechanism 16 so that after condensing on the enclosure walls liquid returns to the internal reservoir to be in contact with the one or more components 10 especially subject to, or susceptible to, heating. It will be understood that alternative or addition means may be provided for transferring condensed liquid to the reservoir.

It will be understood that in a further embodiment that some components may be cooled as in the first embodiment and some components cooled as in the second embodiment.

If an internal temperature of the enclosure drops too low the vapor pressure may become so low that the system needs to be warmed before full voltage hold off can be achieved. If the internal temperature becomes too high the vapor pressure may become excessive and so that protection against bursting of the sealed container becomes necessary. Clearly, when the system has an internal pressure of 1 Bar and is used in an atmosphere at normal temperature and pressure, differential forces on the enclosure structure are virtually neutral.

The invention provides an advantage of using a vapor. If the enclosure were fully filled with liquid then issues of sealing to accommodate vapor pressure would still exist. The advantage is enhanced by use of as small a quantity of liquid dielectric as necessary to form a saturated vapor, taking advantage of a property that the vapor has more than adequate cooling and electrical insulation or voltage hold off properties for a wide variety of applications. A person skilled in the art will understand that liquids other than liquid fluorocarbon may have vapors with suitable characteristics for cooling, low dielectric constant and electrical insulation or voltage hold off.

It will be understood that suitable fluids need to provide an adequate vapor pressure in an expected working temperature range. The vapor should not be corrosive nor react chemically with materials in the enclosure and should not deteriorate with temperature. Fluorocarbons and refrigerant gases are most likely candidates.

In general the relative permittivity of suitable vapors are virtually unity, i.e. the same as free space, whereas the bulk liquid will in general be greater than 2. Air at 750 Torr has a breakdown for a 1.5 mm gap of ~6 kV, whereas for some fluorocarbons (e.g. FC-72) the breakdown voltage is ~12 kV at this spacing with only 190 Torr pressure.

A person skilled in the art will also be aware of factors that need to be employed to ensure purity of the vapor atmosphere and to attain sufficiently hermetic seals on the enclosure.

Although the present invention has been described with reference to preferred embodiments, workers skilled in the art will recognize that changes may be made in form and detail without departing from the spirit and scope of the invention.

I claim:

1. An apparatus for enclosing an electrical apparatus comprising;
    a sealed enclosure adapted to house the electrical apparatus;
    a sealable outlet coupled to the enclosure and adapted to be coupled to an evacuating apparatus to remove air and water vapour from the enclosure; and
    a sealable inlet coupled to the enclosure and adapted to partially fill the enclosure with a liquid from an external reservoir, the liquid having a vapour pressure at operating temperatures of the electrical apparatus so that a saturated vapour from the liquid within the sealed enclosure enhances electrical isolation of the electrical apparatus and provides convective cooling of the electrical apparatus.

2. The apparatus of claim 1, wherein the vapour of the liquid in the sealed enclosure provides a voltage hold-off sufficiently high for operating voltages of the electrical apparatus and has a relative permittivity sufficiently low to prevent stray capacitances due to the vapour above a predetermined limit.

3. The apparatus of claim 1, further comprising a lid adapted to hermetically seal an aperture of the enclosure.

4. The apparatus of claim 1, further comprising an internal reservoir within the enclosure adapted to contain the liquid.

5. The apparatus of claim 4, further comprising a liquid transport device adapted to transport the liquid from the internal reservoir to a component of the electrical apparatus to enhance cooling of the component.

6. The apparatus of claim 5, wherein the liquid transport device comprises a pump.

7. The apparatus of claim 5, wherein the liquid transport device comprises a spray device arranged to spray liquid from the internal reservoir onto the component.

8. The apparatus of claim 4, wherein a component of the electrical apparatus is located at least partially within the internal reservoir to enhance cooling of the component.

9. The apparatus of claim 4, wherein the enclosure is adapted to enable transfer of condensed vapour back into the reservoir.

10. The apparatus of claim 9 wherein at least one wall of the enclosure is arranged to guide condensed vapour towards the reservoir.

11. The apparatus of claim 1, further comprising a fan adapted to force convection within the enclosure to enhance cooling of the electrical apparatus.

12. The apparatus of claim 1, wherein the liquid is a liquid fluorocarbon.

13. A method of enclosing electrical apparatus comprising the steps of:
    a. positioning the electrical apparatus in a hermetically sealable enclosure;
    b. baking the electrical apparatus and enclosure to remove moisture therefrom;
    c. removing air and water vapour from the enclosure;
    d. introducing a liquid into the enclosure to form a saturated vapour from the liquid within the enclosure; and
    e. hermetically sealing the enclosure, wherein the saturated vapour sealed in the enclosure enhances electrical isolation of the electrical apparatus and provides convective cooling of the electrical apparatus.

14. A method as claimed in claim 13, wherein the step of positioning the electrical apparatus in the hermetically sealed enclosure comprises passing the electrical apparatus into the enclosure through at least one aperture and hermetically sealing the aperture with a lid.

15. A method as claimed in claim 13, wherein the step of removing air and water vapour from the enclosure comprises evacuating the enclosure through an outlet and sealing the outlet.

16. A method as claimed in claim 13, wherein the step of introducing a liquid into the enclosure comprises introducing the liquid through an inlet and sealing the inlet.

17. A method as claimed in claim 13, wherein the step of introducing a liquid comprises introducing liquid having a vapour which provides a voltage hold-off sufficiently high for operating voltages of the electrical apparatus and has a relative permittivity sufficiently low to prevent stray capacitance due to the vapour above a predetermined limit.

18. A method as claimed in claim 13 wherein the step of introducing a liquid comprises introducing liquid fluorocarbon.

19. A method as claimed in claim 13, further comprising producing forced convection of the vapour within the enclosure.

20. A method as claimed in claim 13, further comprising transporting liquid from a reservoir within the enclosure to a component of the electrical apparatus to enhance cooling of the component.

21. A method as claimed in claim 20, wherein transporting liquid to a component comprises spraying the component with the liquid.

* * * * *